(12) United States Patent
Koga et al.

(10) Patent No.: US 9,337,355 B2
(45) Date of Patent: May 10, 2016

(54) VOLTAGE NONLINEAR RESISTOR AND MULTILAYER VARISTOR USING SAME

(71) Applicant: Panasonic Intellectual Property Management Co., Ltd., Osaka (JP)

(72) Inventors: Eiichi Koga, Hokkaido (JP); Masayuki Hogiri, Osaka (JP); Yoshiko Higashi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/396,865

(22) PCT Filed: May 23, 2013

(86) PCT No.: PCT/JP2013/003273
§ 371 (c)(1),
(2) Date: Oct. 24, 2014

(87) PCT Pub. No.: WO2013/175794
PCT Pub. Date: Nov. 28, 2013

(65) Prior Publication Data
US 2015/0076490 A1 Mar. 19, 2015

(30) Foreign Application Priority Data
May 25, 2012 (JP) .................................. 2012-119666

(51) Int. Cl.
| | | |
|---|---|---|
| *H01L 29/8605* | (2006.01) | |
| *H01C 7/112* | (2006.01) | |
| *H01C 7/18* | (2006.01) | |
| *H01C 1/14* | (2006.01) | |
| *H01C 7/10* | (2006.01) | |

(52) U.S. Cl.
CPC .............. *H01L 29/8605* (2013.01); *H01C 1/14* (2013.01); *H01C 7/10* (2013.01); *H01C 7/112* (2013.01); *H01C 7/18* (2013.01); *H01L 27/0248* (2013.01); *H01L 29/22* (2013.01); *H01C 1/148* (2013.01); *H01L 27/0288* (2013.01)

(58) Field of Classification Search
CPC .................................................... H01L 29/8605
See application file for complete search history.

(56) References Cited

U.S. PATENT DOCUMENTS

| | | | | |
|---|---|---|---|---|
| 2009/0231084 A1* | 9/2009 | Koga | .................... | C04B 35/453 338/21 |
| 2011/0304946 A1* | 12/2011 | Koga | ................... | H01C 7/1006 361/118 |

FOREIGN PATENT DOCUMENTS

| | | |
|---|---|---|
| JP | 2004-146675 | 5/2004 |
| JP | 2005-079327 | 3/2005 |
| JP | 2007-005500 | 1/2007 |
| JP | 2009-283892 | 12/2009 |
| WO | 2010/122732 | 10/2010 |

OTHER PUBLICATIONS

International Search Report of PCT application No. PCT/JP2013/003273 dated Jul. 9, 2013.

* cited by examiner

*Primary Examiner* — Daniel Shook
(74) *Attorney, Agent, or Firm* — McDermott Will & Emery LLP

(57) ABSTRACT

A voltage nonlinear resistor includes a plurality of N-type ZnO crystal grains, a grain boundary layer, and an oxide grain as a P-type semiconductor. The grain boundary layer is formed between the ZnO crystal grains, and contains at least one kind of oxide of alkaline-earth metal. The oxide grain is disposed between the ZnO crystal grains via the grain boundary layer.

14 Claims, 5 Drawing Sheets

W1 W2

Forward bias side    Reverse bias side
W3 W4

W5

Forward bias side    Reverse bias side
W6

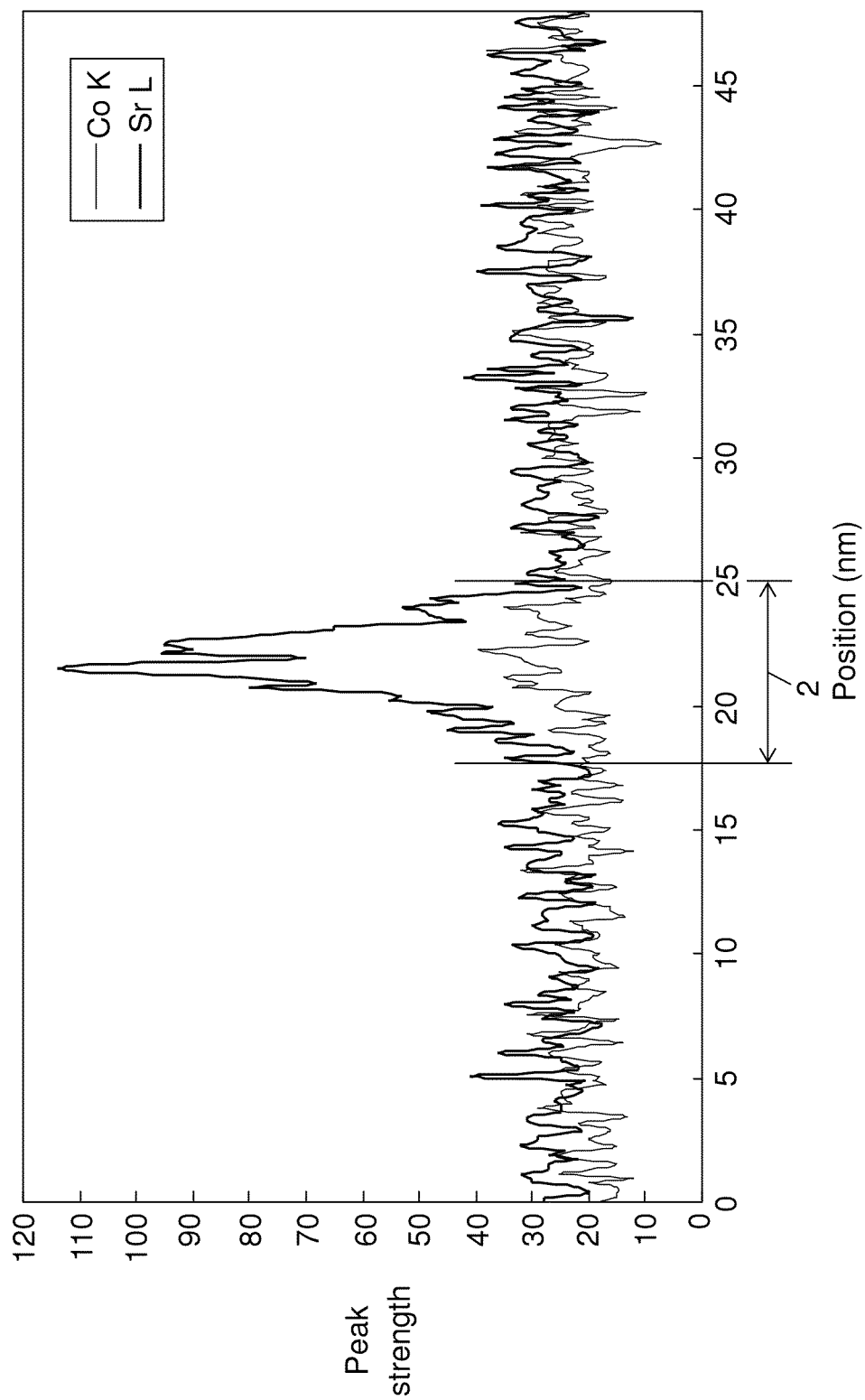

VOLTAGE NONLINEAR RESISTOR AND MULTILAYER VARISTOR USING SAME

TECHNICAL FIELD

The present invention relates to a multilayer varistor appropriate for protecting an electronic apparatus from electrostatic discharge, and more particularly to a voltage nonlinear resistor used in the multilayer varistor.

BACKGROUND ART

A semiconductor device such as an integrated circuit (IC) used in an electronic apparatus can be damaged or the characteristics thereof can be degraded by electrostatic discharge (ESD). Especially, recent semiconductor devices require a high-speed operation, and are thus brittle to ESD. When the semiconductor device is damaged by ESD, the electronic apparatus undergoes a serious obstacle such as a malfunction or failure. Therefore, recently, the importance of measures against ESD becomes high in various electronic apparatuses, and varistors that include a voltage nonlinear resistor having a voltage nonlinearity as an anti-ESD component are widespread.

A varistor used for the measures against ESD must have an excellent characteristic of absorbing the ESD, and have a high ESD resistance so that the varistor itself is not damaged by the ESD. In a state where there is no intruding ESD, the varistor serves simply as capacitance. Therefore, the varistor must have an appropriate capacitance value within the range where an operation of a circuit is not adversely affected.

Such voltage nonlinear resistors used for the measures against ESD are generally classified into two types, Pr base (for example, Patent Literature 1) and Bi base (for example, Patent Literature 2), depending on a varistor characteristic exhibiting additive. A Pr-based multilayer varistor is appropriate for lowering the varistor voltage, and a Bi-based multilayer varistor is appropriate for decreasing the capacitance. The varistor voltage and capacitance can be adjusted by appropriately selecting one of two material bases and appropriately setting the thickness of the varistor layer between electrodes and the overlap area of the electrodes.

CITATION LIST

Patent Literature

PTL 1 Unexamined Japanese Patent Application Publication No. 2004-146675

PTL 2 Unexamined Japanese Patent Application Publication No. 2007-5500

SUMMARY OF THE INVENTION

The present invention provides a voltage nonlinear resistor in which the voltage dependence of the capacitance is reduced, and a multilayer varistor including the voltage nonlinear resistor. The voltage nonlinear resistor of the present invention includes a plurality of N-type ZnO crystal grains, a grain boundary layer, and an oxide grain as a P-type semiconductor. The grain boundary layer is formed among the plurality of ZnO crystal grains, and includes at least one kind of oxide of alkaline-earth metal. The oxide grain is disposed among the plurality of ZnO crystal grains via the grain boundary layer. In the voltage nonlinear resistor, the voltage dependence of the capacitance is reduced thanks to the above-mentioned structure. The multilayer varistor of the present invention includes a pair of internal electrodes, a varistor layer formed between the internal electrodes, and a pair of external electrodes electrically connected to the internal electrodes, respectively. The varistor layer is formed of the above-mentioned voltage nonlinear resistor.

BRIEF DESCRIPTION OF DRAWINGS

FIG. 6 is a graph showing a result obtained by line-analyzing the concentration distribution of Sr elements and Co elements in the grain boundary layer of the voltage nonlinear resistor in accordance with the exemplary embodiment of the present invention.

DESCRIPTION OF EMBODIMENTS

Prior to the description of the exemplary embodiments of the present invention, problems of a conventional voltage nonlinear resistor are described. The capacitance of a Pr-based or Bi-based conventional voltage nonlinear resistor has voltage dependence. More specifically, as the applied voltage value increases, the capacitance decreases. Therefore, when the voltage nonlinear resistor is mounted on an actual circuit and a circuit voltage is applied to it, the capacitance value varies depending on the applied voltage value and a problem such as a malfunction can be caused. In an electronic component for a signal line represented by a recent mobile electronic apparatus, the stability of the signal quality is strongly demanded. Therefore, in a varistor mounted on the signal line, it is desired that variation in capacitance due to the applied voltage value is small.

The capacitance of the conventional voltage nonlinear resistor depends on a grain boundary structure among ZnO crystal grains, which exhibit the varistor characteristic. It is considered that the capacitance has voltage dependence because the width of a depletion layer in a double Schottky barrier depends on the voltage. The double Schottky barrier is formed at an interface part of the ZnO crystal grains.

Figure 1A:
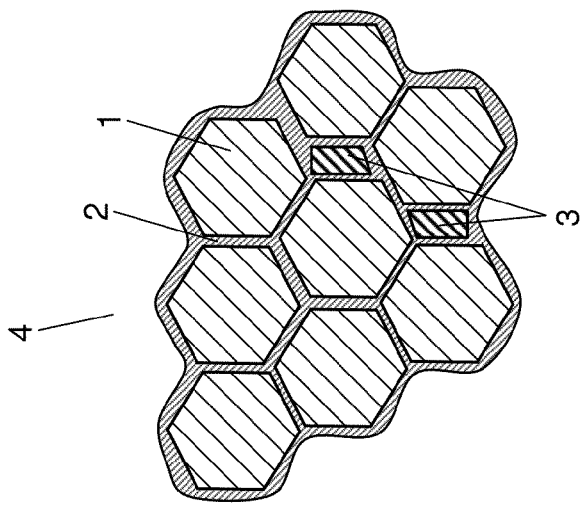
FIG. 1A is a sectional schematic illustration of a fine composition of a voltage nonlinear resistor in accordance with an exemplary embodiment of the present invention.
Figure 1B:
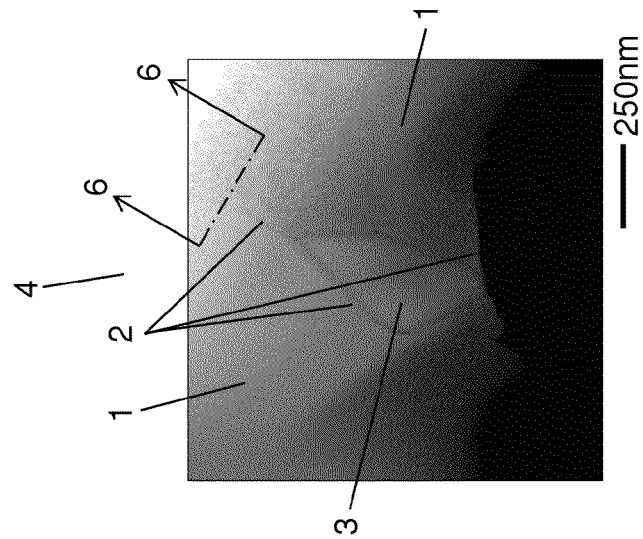
FIG. 1B is a sectional image view of the voltage nonlinear resistor of FIG. 1A that is observed by a transmission electron microscope (TEM).
Figure 1C:
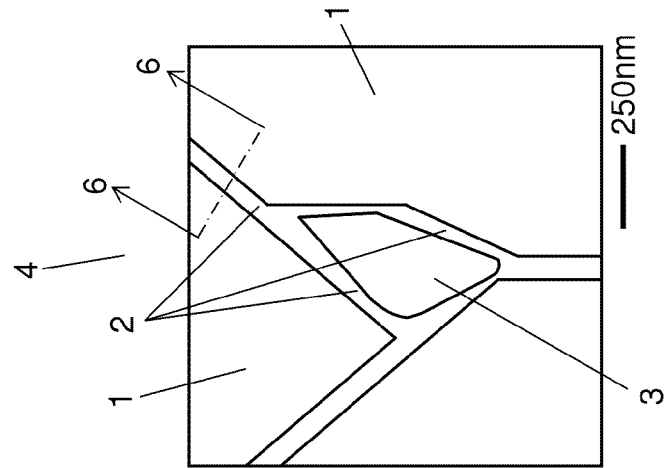
FIG. 1C is a schematic illustration of FIG. 1B.

Hereinafter, the exemplary embodiment of the present invention will be described with reference to the accompanying drawings. FIG. 1A is a sectional schematic illustration of a fine composition of voltage nonlinear resistor 4 in accordance with the exemplary embodiment of the present invention. FIG. 1B is a sectional image view of voltage nonlinear resistor 4 that is observed by a transmission electron microscope (TEM). In other words, FIG. 1B is a sectional enlarged photograph obtained by observing, with a high-resolution TEM, the proximity of oxide grain 3 shown in FIG. 1A in a specimen that is produced by thinning voltage nonlinear resistor 4 by Ar milling. FIG. 1C is a schematic illustration of FIG. 1B.

Voltage nonlinear resistor 4 includes a plurality of ZnO crystal grains 1, grain boundary layer 2, and oxide grains 3. Grain boundary layer 2 contains at least one kind of alkaline-earth metal and is disposed among ZnO crystal grains 1. Oxide grains 3 are disposed between ZnO crystal grains 1 via grain boundary layer 2. In other words, grain boundary layer 2 is interposed in the grain boundary among ZnO crystal grains 1, and oxide grains 3 are disposed inside grain boundary layer 2. ZnO crystal grains 1 are bound together via grain boundary layer 2 and oxide grains 3.

Furthermore, in other words, as shown in FIG. 1B and FIG. 1C, oxide grains 3 are interposed among ZnO crystal grains 1 via grain boundary layer 2.

Regarding the fine composition of voltage nonlinear resistor 4, ZnO crystal grains 1, grain boundary layer 2, and oxide grains 3 can be observed with the high-resolution TEM, for example. Elemental analysis of ZnO crystal grains 1, grain boundary layer 2, and oxide grains 3 can be performed using energy dispersive X-ray spectrometry (EDS).

Grain boundary layer 2 and oxide grains 3 are produced by sintering ZnO crystal grains 1 together with oxide of alkaline-earth metal in a coexisting state of them. By this method, grain boundary layer 2 made of the oxide of alkaline-earth metal are distributed to every grain boundary among ZnO crystal grains 1. Oxide grains 3 serve as surplus components and finally constitute the fine composition. Thus, by an industrial manufacturing process using a solid reaction method, voltage nonlinear resistor 4 in which the voltage dependence of the capacitance is reduced can be stably manufactured. In other words, it is preferable that oxide grains 3 are made of the same material as that of grain boundary layer 2, because the productivity is improved in this case. However, grain boundary layer 2 and oxide grains 3 may be made of different materials from each other.

Next, the structural difference between the conventional voltage nonlinear resistor and voltage nonlinear resistor 4, and the influence of this difference on the voltage dependence of the capacitance are described.

The conventional voltage nonlinear resistor is formed of a plurality of ZnO crystal grains and a grain boundary layer. In this structure, an acceptor level is generated on the connection interfaces between surfaces of the ZnO crystal grains and grain boundary layer, and a varistor characteristic is exhibited by an excellent barrier characteristic in a polycrystalline composition.

On the other hand, in voltage nonlinear resistor 4, oxide grains 3 exist inside grain boundary layer 2 in a barrier at the grain boundary among ZnO crystal grains 1. Voltage nonlinear resistor 4 is structurally different from the conventional voltage nonlinear resistor in this point.

Grain boundary layer 2 in voltage nonlinear resistor 4 serve as a source for exhibiting the barrier characteristic (varistor characteristic) in the polycrystalline composition. In other words, it is considered that, also in voltage nonlinear resistor 4, grain boundary layer 2 plays the same role as in the conventional voltage nonlinear resistor. For example, when alkaline-earth metal is Sr, and Sr is combined with Co, grain boundary layer 2 is made of $SrCoO_3$.

Figure 2A:
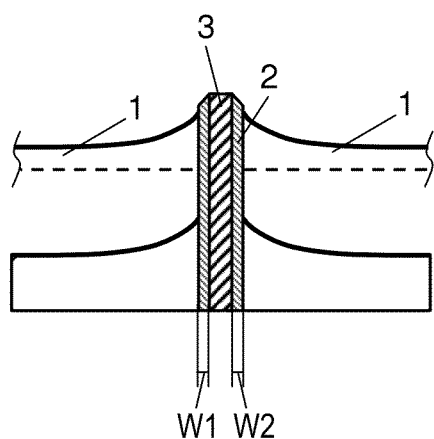
FIG. 2A is a schematic illustration showing an energy barrier structure in a grain boundary of the voltage nonlinear resistor in accordance with the exemplary embodiment of the present invention before a bias voltage is applied.
Figure 2B:
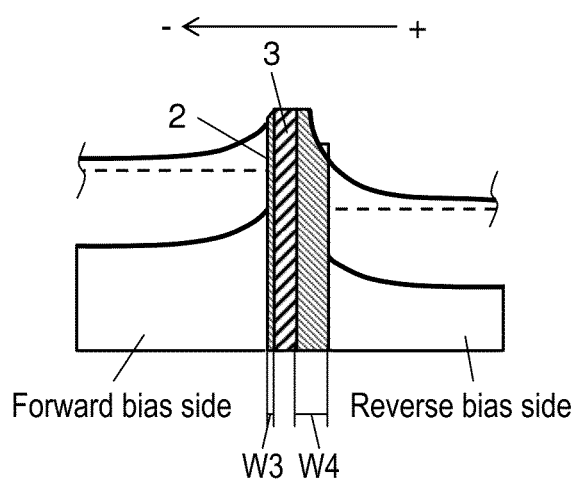
FIG. 2B is a schematic illustration showing the energy barrier structure in the grain boundary of the voltage nonlinear resistor in accordance with the exemplary embodiment of the present invention after the bias voltage is applied.
Figure 2C:
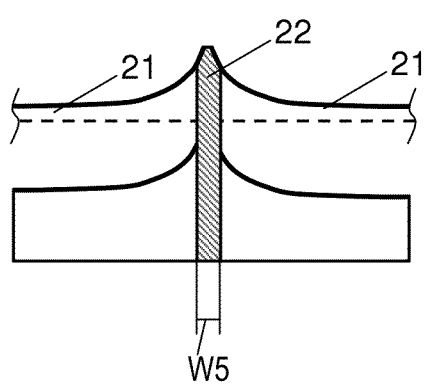
FIG. 2C is a schematic illustration showing an energy barrier structure in a grain boundary of a voltage nonlinear resistor different from that in accordance with the exemplary embodiment of the present invention before a bias voltage is applied.
Figure 2D:
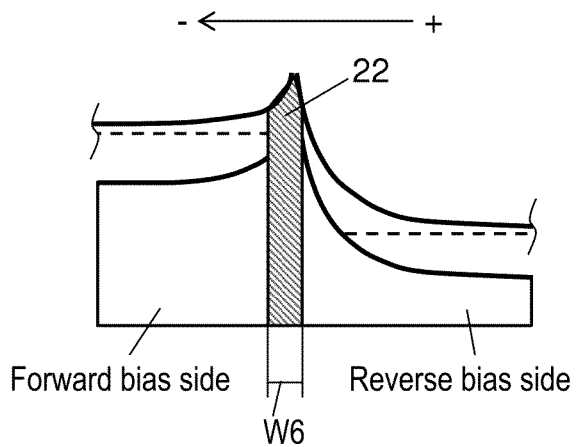
FIG. 2D is a schematic illustration showing the energy barrier structure in the grain boundary of the voltage nonlinear resistor different from that in accordance with the exemplary embodiment of the present invention after the bias voltage is applied.

FIG. 2A and FIG. 2B are schematic illustrations each showing an energy barrier structure of voltage nonlinear resistor 4. FIG. 2C and FIG. 2D are schematic illustrations each showing an energy barrier structure of the conventional voltage nonlinear resistor. FIG. 2A and FIG. 2C show the case where a bias voltage is not applied. FIG. 2B and FIG. 2D show the case where a bias voltage is applied.

As shown in FIG. 2C, the energy barrier structure of the conventional voltage nonlinear resistor is ZnO crystal grain 21/ZnO crystal grain 21. In other words, grain boundary layer 22 is sandwiched between ZnO crystal grain 21 and ZnO crystal grain 21 and it can be considered that an electric conductive structure of N type/N type is formed.

In this structure, the width of grain boundary layer 22 (depletion layer) in a double Schottky barrier that is formed in an interface part between ZnO crystal grains 21 is W5 when a bias voltage is not applied. However, when a bias voltage is applied, the width of grain boundary layer 22 (depletion layer) increases to W6 as shown in FIG. 2D. Therefore, it is considered that the apparent capacitance change rate is large.

On the other hand, the energy barrier structure of voltage nonlinear resistor 4 is ZnO crystal grain 1/oxide grain 3/ZnO crystal grain 1 as shown in FIG. 2A. Therefore, it can be considered that an electric conductive structure of N type/P type/N type is formed such that one grain boundary between ZnO crystal grain 1 and ZnO crystal grain 1 is sandwiched between two barrier layers.

In such an energy barrier model, as shown in FIG. 2A, grain boundary layer 2 (depletion layer) is disposed on each of both joint surfaces between oxide grain 3 (P type) and ZnO crystal grains 1 (N type), which sandwich oxide grain 3. In this energy barrier model, when a bias voltage is applied as shown in FIG. 2B, width W2 of grain boundary layer 2 (depletion layer) on the NP side (reverse bias) increases to W4 similarly to width W6 of the grain boundary layer (depletion layer) of the conventional voltage nonlinear resistor. While, width W1 of grain boundary layer 2 (depletion layer) on the PN side (forward bias) decreases to W3. Therefore, when a voltage is applied to voltage nonlinear resistor 4, the total width of grain boundary layer 2 becomes W3+W4. At this time, it is considered that the decrease in W1 cancels the increase in W2 and the apparent capacitance change rate is small.

It is considered that, thanks to this mechanism, the voltage dependence of the capacitance decreases more significantly in voltage nonlinear resistor 4 than in the conventional voltage nonlinear resistor.

The above-mentioned energy barrier structure model can be verified using zener diodes (NIP type structure) including the NP surface. In the model of voltage nonlinear resistor 4, grain boundary layers 2 (depletion layer) are formed on the interfaces of N-type compositions (ZnO crystal grains 1)

between which a P-type composition (oxide grain 3) is sandwiched. The basic unit structure of the model can be represented by "NP+PN" structure where two zener diodes (N/P type structures) are interconnected. The varistor characteristic of the "NP+PN" is determined by a barrier of only the NP junction indicating the reverse bias. That is because the PN junction indicates the forward direction and hardly contributes to the varistor characteristic. Thus, by repeatedly connecting zener diodes to each other using "NP+PN" as a basic unit, the model of voltage nonlinear resistor 4 as a polycrystalline model can be represented. Specifically, by repeated connection such as NP⇒NP+PN⇒"NP+PN"+"NP+PN"⇒"NP+PN"+"NP+PN"+"NP+PN", it can be confirmed that the bias voltage dependence of the capacitance is decreased while the varistor characteristic is exhibited.

Figure 3:
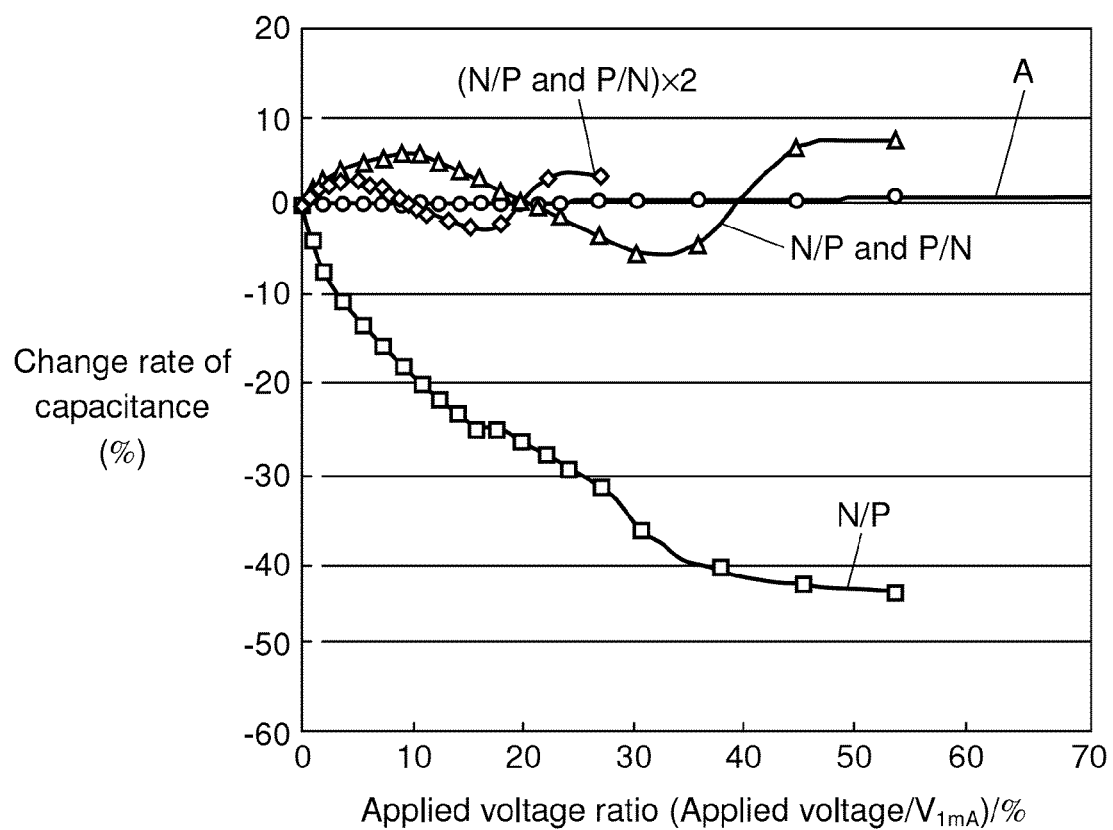
FIG. 3 is a graph showing the relationship between the configuration of a zener diode and the voltage dependence of the capacitance, and showing the voltage dependence of the capacitance of a multilayer varistor produced using the voltage nonlinear resistor in accordance with the exemplary embodiment of the present invention.

FIG. 3 shows the result obtained by measuring the change rate of the capacitance caused by an applied voltage after these zener diodes (N/P type structure) are interconnected. Line A shows the characteristic of the multilayer varistor of sample A in a later described example. According to FIG. 3, as the number of repetitions of the N/P type is increased, the change rate of the capacitance decreases and is apt to asymptotically approach the characteristic of sample A.

Thus, a polycrystalline structure model where many "NP+PN" structures are interconnected has an effect of reducing the voltage dependence of the capacitance. These verification results allow the following estimation: voltage nonlinear resistor 4 includes oxide grain 3 serving as a P-type semiconductor, ZnO crystal grains 1 serving as N-type semiconductors, and grain boundary layer 2 (depletion layers); and voltage nonlinear resistor 4 has a repetition structure of "NP+PN" (described above).

Oxide grain 3 is not especially limited as long as it serves as a P-type semiconductor.

The crystal structure of oxide grains 3 can be confirmed based on the X-ray diffraction pattern. Oxide grains 3 are scattered as deposits in the clearances that are formed between ZnO crystal grains 1 or among three or more ZnO crystal grains 1, and can be observed also with a scanning electron microscope (SEM). The volume of deposited oxide grains 3 can be estimated based on the area ratio of oxide grains 3 to ZnO crystal grains 1. The area ratio is obtained when the cross section is observed. More preferably, the ratio of deposited oxide grains 3 with respect to the whole amount of ZnO falls within a range from 0.5 atom % to 10 atom %, inclusive. When the ratio of deposited oxide grains 3 falls within the range, the voltage dependence of the capacitance can be further reduced.

It is preferable that the alkaline-earth metal contained in the oxide constituting grain boundary layers 2 be selected from a group consisting of Sr, Ca, and Ba. Thus, the varistor voltage can be low and the nonlinearity can be superior.

Grain boundary layer 2 and oxide grains 3 are not especially limited. However, it is preferable that they be solid solutions having a perovskite structure made of oxide of alkaline-earth metal. Thus, the varistor voltage can be low and the nonlinearity can be superior.

It is also preferable that the thickness of grain boundary layer 2 (distance between ZnO crystal grains 1) be 1 nm or more and 10 nm or less. Thus, the voltage nonlinearity can be superior and the ESD resistance can be high.

It is also preferable that the average crystal grain size of ZnO crystal grains 1 be 0.5 μm or more and 2 μm or less. Thus, the ESD resistance can be improved, and voltage nonlinear resistor 4 appropriate for an anti-ESD varistor can be achieved.

It is also preferable that voltage nonlinear resistor 4 contains 0.0001 mol or more and 0.003 mol or less of Al in $Al_2O_3$ terms for 1 mol of ZnO. The action of Al is not obvious, but, when voltage nonlinear resistor 4 contains Al components within the range, the grain sizes of ZnO crystal grains 1 and oxide grains 3 are made uniform, respectively. Therefore, the crystal grains become dense during sintering, voltage nonlinear resistor 4 can exhibit lower varistor voltage. The decrease in varistor voltage improves voltage nonlinearity a and ESD resistance $\Delta V_{1mA}$ of voltage nonlinear resistor 4, and more reliable voltage nonlinear resistor 4 can be achieved.

Varistor voltage $V_{1mA}$, voltage nonlinearity a, and ESD resistance $\Delta V_{1mA}$ are described in detail together with the description of the example. Generally, when a ceramic composition is made uniform, the mechanical strength of voltage nonlinear resistor 4 is improved. Therefore, reliability against thermal impulse and drop impact of an apparatus are improved.

Figure 4:
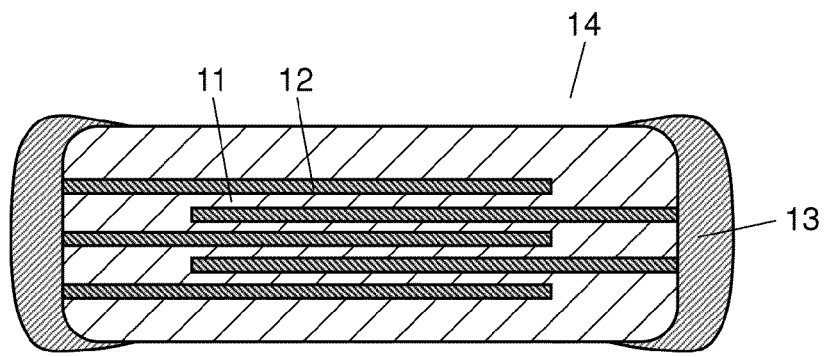
FIG. 4 is a sectional schematic illustration of the multilayer varistor in accordance with the exemplary embodiment of the present invention.

Next, multilayer varistor 14 produced using voltage nonlinear resistor 4 is described with reference to FIG. 4. Multilayer varistor 14 includes at least a pair of internal electrodes 12, varistor layer 11 formed between internal electrodes 12, and a pair of external electrodes 13 electrically connected to respective internal electrodes 12. Varistor layer 11 is formed of voltage nonlinear resistor 4. External electrodes 13 are formed at ends of a laminated body including internal electrodes 12 and varistor layers 11.

In order to exhibit the varistor characteristic, it is enough that voltage nonlinear resistor 4 is formed between the pair of internal electrodes 12. The material disposed on the upper and lower surfaces of the pair of internal electrodes 12 is not limited. However, when a material different from voltage nonlinear resistor 4 is disposed on the upper and lower surfaces (outside) of the pair of internal electrodes 12, the varistor characteristic can be decreased by atom diffusion or the like between different materials. Therefore, it is preferable that a material similar to voltage nonlinear resistor 4 formed between the pair of internal electrodes 12 be disposed on the upper and lower surfaces of the pair of internal electrodes 12 as shown in FIG. 4.

Next, an example of the method of manufacturing multilayer varistor 14 is described. First, as starting (raw) materials, ZnO powder as a main component, $SrCO_3$ powder including alkaline-earth metal and $Co_2O_3$ powder as subcomponents, and chemically high-purity $Al_2O_3$ powder are prepared, and are weighed to a desired composition. Alternatively, powder obtained by substituting Sr element in $SrCO_3$ powder by Ba element or Ca element may be employed.

$SrCO_3$ powder and $Co_2O_3$ powder are raw materials of grain boundary layer 2 and oxide grains 3. $SrCO_3$ powder and $Co_2O_3$ powder are previously mixed with pure water and stabilized-zirconia-made balls having a diameter of 1.0 mm for 20 hours in a polyethylene-made ball mill, thereby making the average grain size become 0.3 μm±0.03 μm. By previously making the average grain size of the $SrCO_3$ powder and $Co_2O_3$ powder smaller than the average grain size of the ZnO powder, the $SrCO_3$ powder and $Co_2O_3$ powder are apt to expand uniformly and wetly on the surface of the ZnO powder, and the fine structure of voltage nonlinear resistor 4 is formed.

Next, these starting material powders are put into the polyethylene-made ball mill, pure water and stabilized-zirconia-made balls having a diameter of 2 mm are added, they are mixed with each other for 20 hours, thereafter, they are crushed so that the average grain size becomes 0.5 μm±0.05 μm, and then they are dehydrated and dried.

The dried powder is granulated through a sieve having 20 meshes, then is put into a high-purity alumina crucible, and is calcined for 2 hours in the atmosphere at about 750° C. to 950° C. Then, the calcined powder is put into the polyethylene-made ball mill similarly to the mixing process, pure water and stabilized-zirconia-made balls are added, and they are crushed for 20 hours so that the average grain size becomes 0.5 µm±0.1 µm. After that, they are dehydrated and dried until the moisture content becomes 0.1% or less.

The dehydrated and dried powder, an organic binder or the like, and a dispersion medium are mixed, thereby preparing slurry. At this time, the agglomeration is suppressed to disperse the slurry uniformly such that the average grain size of the dispersed material becomes 0.70 µm±0.10 µm. The slurry prepared in this manner is sheet-formed to produce a ceramic sheet.

Here, the average grain size means D50, and is evaluated based on the volume grain size distribution obtained by a grain size distribution device of a laser diffraction scattering type. Specifically, the slurry in which a specimen is dispersed is diluted with a dispersion medium for dilution, and then is dispersed uniformly by a homogenizer. Thus, a specimen for measurement is prepared and is put into the device, and the grain size distribution thereof is measured.

When the dispersion medium contained in the slurry is water, an aqueous solution of sodium hexametaphosphate can be employed as the dispersion medium for dilution. When the dispersion medium contained in the slurry is an organic solvent, ethanol can be employed as the dispersion medium for dilution.

Next, a predetermined number of ceramic sheets (mentioned above) are prepared, a conductive paste for an internal electrode that is obtained by mixing Ag—Pd alloy grains with an organic binder is printed on each ceramic sheet by a screen printing method, thereby forming a conductor layer. The ceramic sheets having the conductor layer thereon and the ceramic sheets on which the conductive paste is not printed are stacked in a predetermined shape. By pressurizing this laminated body, a laminated body block is produced.

Next, the laminated body block is cut and divided into laminated body chips having a desired size. The laminated body chips are heated to about 500° C. in the atmosphere for de-binding, and are further fired at 1000° C. or more and 1100° C. or less in the atmosphere, thereby producing a ceramic sintered body.

Next, the ceramic sintered body is barrel-polished to expose internal electrode 12 on both end surfaces of the ceramic sintered body. Then, a glass-made insulating layer is formed on side surfaces (surfaces other than the surfaces on which internal electrode 12 is exposed) of the ceramic sintered body.

Next, a conductive paste for an external electrode that is obtained by mixing Ag—Pd alloy grains with an organic binder is applied to the surfaces on which internal electrode 12 is exposed, then is dried, and is baked at 1000° C. or more and 1100° C. or less in the atmosphere, thereby forming external electrodes 13. Thus, multilayer varistor 14 is completed.

When the surfaces of external electrodes 13 are coated with metal such as Ni—Sn having a high weather resistance by an electrolytic plating method, the degradation of external electrodes 13 due to oxidation or the like can be suppressed.

Example

Hereinafter, multilayer varistor 14 produced by the above-mentioned manufacturing method and a multilayer varistor produced by using the conventional voltage nonlinear resistor are described in detail.

Sample A shown in Table 1 is multilayer varistor 14 including voltage nonlinear resistor 4. The starting material of sample A is a mixture that is obtained by adding chemically high-purity $Al_2O_3$ powder to 97.5 atm % of ZnO powder as the main component, 1.25 atm % of $SrCO_3$ powder, and 1.25 atm % of $Co_2O_3$ powder. The additive amount of $Al_2O_3$ powder is 0.002 mol for 1 mol of ZnO. The calcination temperature is set at 800° C., the de-binding temperature of a laminated body chip is set at 400° C., the firing temperature in the atmosphere is set at 1030° C., and the baking temperature of external electrodes 13 is set at 720° C.

As the multilayer varistor produced by using the conventional voltage nonlinear resistor, sample B representing a Bi-based multilayer varistor and sample C representing a Pr-based multilayer varistor are employed.

The starting material of sample B is a mixture that is obtained by adding chemically high-purity $Al_2O_3$ powder to 94.5 atm % of ZnO powder as the main component, 0.1 atm % of $Bi_2O_3$ powder, 0.5 atm % of CoO powder, 0.6 atm % of MnO powder, 0.3 atm % of $Sb_2O_3$ powder, and 4.0 atm % of $SiO_2$ powder. The additive amount of $Al_2O_3$ powder is 0.001 mol for 1 mol of ZnO.

The starting material of sample C is a mixture that is obtained by adding chemically high-purity $Al_2O_3$ powder to 97.5 atm % of ZnO powder as the main component, 0.6 atm % of $Pr_2O_3$ powder, 1.6 atm % of CoO powder, 0.1 atm % of $Cr_2O_3$ powder, and 0.2 atm % of CaO powder. The additive amount of $Al_2O_3$ powder is 0.01 mol for 1 mol of ZnO.

Except for the starting materials, the voltage nonlinear resistors of sample B and sample C are prepared similarly to sample A. Varistor voltage $V_{1mA}$ of sample B is 12 V class, and varistor voltage $V_{1mA}$ of sample C is 8 V class.

All of sample A to sample C have the same outside dimensions. The longitudinal dimension is 1.0 mm, the width is 0.5 mm, and the thickness is 0.5 mm. The thickness of varistor layer 11 disposed between internal electrodes 12 is about 20 µm, the number of internal electrodes 12 is 10, and the area per layer (overlap area of internal electrodes 12) is about 0.06 $mm^2$.

As the electrical characteristic, varistor voltage $V_{1mA}$, voltage nonlinearity α, ESD resistance $\Delta V_{1mA}$, and voltage dependence ΔC of capacitance C of 10 pieces of each of the samples are measured, and the average values are determined.

Varistor voltage $V_{1mA}$ is a voltage value between the terminals when current of 1 mA flows. Voltage nonlinearity α is a ratio of voltage value $V_{1mA}$ when current of 1 mA flows to voltage value $V_{10\mu A}$ when current of 10 µA flows, namely $\alpha=V_{1mA}/V_{10\mu A}$.

Capacitance C is measured in the condition where the measurement frequency is 1 MHz, the measurement voltage is 1 Vrms, and there is no DC bias. Next, capacitance C' when DC voltage is applied is measured, and ΔC=C'-C is determined. Meanwhile, the DC voltage applied at this time is normalized with respect to varistor voltage $V_{1mA}$, and voltage applying rate is determined. When the capacitance has voltage dependence, change rate ΔC of capacitance C depends on the applied voltage ratio. Therefore, variation of change rate ΔC with respect to the applied voltage ratio is evaluated.

The ESD resistance is evaluated in conformity with IEC61000-4-2. In other words, varistor voltage $V_{1mA}$ is measured before and after an ESD voltage of 8 kV (charging capacity is 150 pF, and discharge resistance is 330Ω) is applied from an electrostatic discharge simulator to the multilayer varistor. Change rate $\Delta V_{1mA}$ is calculated by subtracting the value of varistor voltage $V_{1mA}$ before the ESD voltage is applied from the value of varistor voltage $V_{1mA}$ after the ESD voltage is applied. Based on the image observed with an electron microscope, average crystal grain size $D_g$ of ZnO crystal grains 1 is evaluated by an intercept method.

Figure 5:
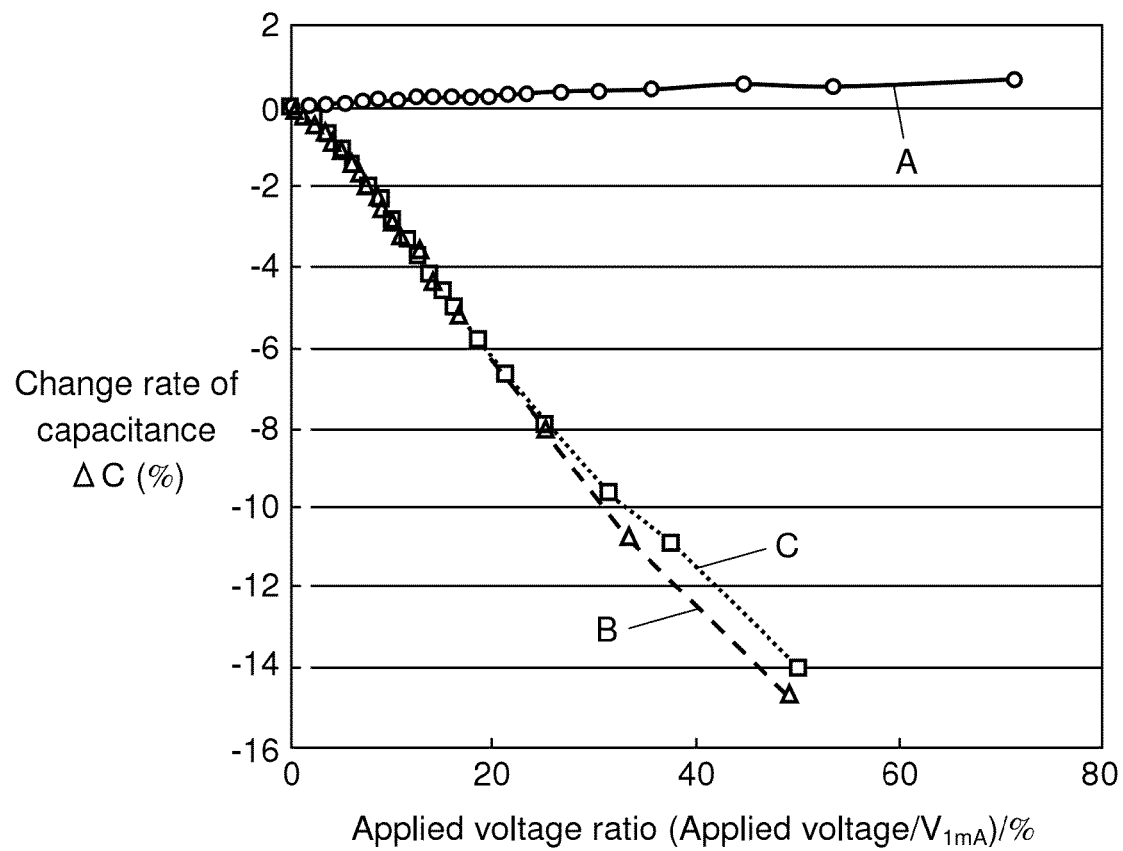
FIG. 5 is a graph showing the voltage dependence of the capacitance in the multilayer varistor in accordance with the exemplary embodiment of the present invention and in examples of the conventional multilayer varistor.

The evaluation results are shown in Table 1 and FIG. 5. ΔC in Table 1 shows the values at an applied voltage ratio of 50%.

TABLE 1

| | Electrical characteristics | | | | Crystal | |
|---|---|---|---|---|---|---|
| Sample | Varistor voltage $V_{1\,mA}(V)$ | Nonlinearity $\alpha(V_{1\,mA}/V_{10\,\mu A})$ | ESD resistance $\Delta V_{1\,mA}(\%)$ | Capacitance C(pF) | Change rate of capacitance ΔC(%) | grain size (μm) | Remarks |
| A | 5.8 | 1.12 | 0.3 | 134 | 0.5 | 1.7 | SrCo base |
| B | 12.6 | 1.25 | −18 | 151 | −14.4 | 2.7 | Bi base |
| C | 8.2 | 1.16 | 0.6 | 148 | −14 | 2.3 | Pr base |

First, varistor voltages $V_{1mA}$, voltage nonlinearities a, and ESD resistances $\Delta V_{1mA}$ of sample A to sample C are described. Varistor voltage $V_{1mA}$ of sample A is 5.8 V, and is lower than those of sample B and sample C. Voltage nonlinearity a of sample A is more excellent than that of sample B, and indicates substantially the same value as that of sample C.

Generally, when varistor voltages $V_{1mA}$ is low, the ESD resistance is also low. However, ESD resistance $\Delta V_{1mA}$ of sample A having the lowest varistor voltage is 0.3%. In other words, the change rate of varistor voltage $V_{1mA}$ is smaller than those of sample B and sample C. Thus, sample A has an excellent varistor characteristic.

Next, the voltage dependence of the capacitance is described in detail with reference to FIG. 5. FIG. 5 is a graph showing the voltage dependence of capacitance C of sample A to sample C.

As is clear from FIG. 5, change rates ΔC of sample B and sample C have a high voltage dependence, and the capacitance decreases as the applied voltage ratio increases. As shown in Table 1, change rates ΔC at an applied voltage ratio of 50% arrive at about −14% in both sample B and sample C. On the other hand, change rate ΔC of sample A is about +0.5%, and is obviously smaller than those of sample B and sample C. Thus, the voltage dependence of capacitance C is extremely small in sample A.

Next, the result obtained when the distribution of Sr element and Co element in grain boundary layer 2 of voltage nonlinear resistor 4 is elementally analyzed using the high-resolution TEM and the EDS is shown in FIG. 6. FIG. 6 shows a result obtained by line-analyzing the concentration of Sr element and Co element on the line 6-6 of FIG. 1B and FIG. 1C. The thickness (width) of grain boundary layer 2 on the line 6-6 is about 7 nm, and oxide containing Sr and Co exists at a high concentration in grain boundary layer 2. The thickness of grain boundary layer 2 partially varies in a range of about 1 nm to 10 nm. According to the elemental analysis by the EDS, the volume of deposited oxide grains 3 is 2.1 atm % with respect to the total of ZnO powder.

Thus, by using voltage nonlinear resistor 4 as varistor layer 11, the varistor voltage is decreased, the ESD resistance is increased, and the voltage dependence of the capacitance can be extremely reduced.

INDUSTRIAL APPLICABILITY

A multilayer varistor including a voltage nonlinear resistor of the present invention has a low varistor voltage and an extremely high ESD resistance. The voltage dependence of the capacitance is low. Therefore, the multilayer varistor is especially useful as a varistor appropriate for the measures against ESD in various electronic apparatuses.

REFERENCE MARKS IN THE DRAWINGS 1, 21 ZnO crystal grain
2, 22 grain boundary layer
3 oxide grain
4 voltage nonlinear resistor
11 varistor layer
12 internal electrode
13 external electrode
14 multilayer varistor

The invention claimed is:

1. A voltage nonlinear resistor comprising:
   a plurality of N-type ZnO crystal grains;
   a grain boundary layer formed among the plurality of N-type ZnO crystal grains, and including an oxide containing an alkaline-earth metal; and
   an oxide grain as a P-type semiconductor disposed among the plurality of N-type ZnO crystal grains via the grain boundary layer.

2. The voltage nonlinear resistor according to claim 1, wherein
   the alkaline-earth metal contained in the oxide constituting the grain boundary layer is selected from a group consisting of Sr, Ca, and Ba.

3. The voltage nonlinear resistor according to claim 1, wherein
   the oxide grain is made of a material identical to that of the grain boundary layer.

4. The voltage nonlinear resistor according to claim 1, wherein
   the grain boundary layer is a solid solution having a perovskite structure, and
   the oxide grain is a solid solution having a perovskite structure.

5. The voltage nonlinear resistor according to claim 1, wherein
   a thickness of the grain boundary layer is 1 nm or more and 10 nm or less.

6. The voltage nonlinear resistor according to claim 1, wherein
   an average crystal grain size of the plurality of ZnO crystal grains is 0.5 μm or more and 2 μm or less.

7. The voltage nonlinear resistor according to claim 1, containing
   0.0001 mol or more and 0.003 mol or less of Al in $Al_2O_3$ terms for 1 mol of ZnO that is contained in the nonlinear resistor.

8. A multilayer varistor comprising:
   a pair of internal electrodes;
   a varistor layer formed between the pair of internal electrodes; and a pair of external electrodes electrically connected to the pair of internal electrodes, respectively,
wherein the varistor layer is formed of a voltage nonlinear resistor including:
a plurality of N-type ZnO crystal grains;
a grain boundary layer formed among the plurality of N-type ZnO crystal grains, and including an oxide containing an alkaline-earth metal; and
an oxide grain as a P-type semiconductor disposed among the plurality of N-type ZnO crystal grains via the grain boundary layer.

9. The multilayer varistor according to claim 8, wherein the alkaline-earth metal contained in the oxide constituting the grain boundary layer is selected from a group consisting of Sr, Ca, and Ba.

10. The multilayer varistor according to claim 8, wherein the oxide grain is made of a material identical to that of the grain boundary layer.

11. The multilayer varistor according to claim 8, wherein the grain boundary layer is a solid solution having a perovskite structure, and
the oxide grain is a solid solution having a perovskite structure.

12. The multilayer varistor according to claim 8, wherein a thickness of the grain boundary layer is 1 nm or more and 10 nm or less.

13. The multilayer varistor according to claim 8, wherein an average crystal grain size of the plurality of ZnO crystal grains is 0.5 μm or more and 2 μm or less.

14. The multilayer varistor according to claim 8, containing
0.0001 mol or more and 0.003 mol or less of Al in $Al_2O_3$ terms for 1 mol of ZnO that is contained in the nonlinear resistor.

* * * * *